United States Patent [19]

Yoshimoto et al.

[11] Patent Number: 5,004,901

[45] Date of Patent: Apr. 2, 1991

[54] CURRENT MIRROR AMPLIFIER FOR USE IN AN OPTICAL DATA MEDIUM DRIVING APPARATUS AND SERVO-CIRCUIT

[75] Inventors: Kyosuke Yoshimoto; Kyouji Shimoda, both of Amagasaki, Japan

[73] Assignee: Mitsubishi Denki Kabushiki Kaisha, Tokyo, Japan

[21] Appl. No.: 212,566

[22] Filed: Jun. 28, 1988

[30] Foreign Application Priority Data

Jun. 30, 1987 [JP] Japan .............................. 62-160841
Jun. 4, 1987 [JP] Japan .............................. 62-139044

[51] Int. Cl.$^5$ .......................... G01J 1/20; H03K 3/01
[52] U.S. Cl. ....................... 250/201.5; 250/214 AG; 250/214 A; 307/270; 369/44.29
[58] Field of Search ............... 250/201.1, 201.4, 201.5, 250/214 A, 214 R, 214 AG; 369/44, 45, 46, 116, 124, 44.25, 44.29, 44.35, 44.36, 44.41; 307/270, 241, 243, 254, 311

[56] References Cited

U.S. PATENT DOCUMENTS

| | | | |
|---|---|---|---|
| 4,141,004 | 2/1979 | Craven | 307/241 |
| 4,446,545 | 5/1984 | Van Dijk | 369/44 |
| 4,528,463 | 7/1985 | Kung | 307/270 |
| 4,617,654 | 10/1986 | Gross et al. | 369/45 |
| 4,647,793 | 3/1987 | Davis | 307/270 |
| 4,661,944 | 4/1987 | Van Sluys | 369/44 |
| 4,663,749 | 5/1987 | Bierhoff et al. | 369/44 |
| 4,703,466 | 10/1987 | Konno | 250/201.4 |

OTHER PUBLICATIONS

Mitchell, "Monolithic Current Source", *IBM Tech. Dis. Bull.*, vol. 13, No. 12, 5/71, p. 3720.
Ito et al., "Improvement of Focusing and Tracking Servos in Optical Disk Memory", SPIE, vol. 529, Optical Mass Data Storage, 1985, pp. 145-9.

Primary Examiner—David C. Nelms
Assistant Examiner—Michael Messinger
Attorney, Agent, or Firm—Wolf, Greenfield & Sacks

[57] ABSTRACT

An optical data medium driving apparatus which constitutes amplifiers for an output current signal of a photosensor including a plurality of current mirror circuits having different amplification factors in order to switch, in a wide range, the output current signal of the photosensor. The photosensor detects a quantity of the reflected light corresponding to a variation of the quantity of reflected light from an optical data medium having various characteristics. The output is obtained with high accuracy and in a wide band. A servo-circuit is used for an AGC circuit and normalizes a difference signal from each light receiving surface at a photosensor having a plurality of light receiving surfaces. An A/D converter is given the difference signal as an analog input signal and the sum signal as the reference input signal. The A/D converter outputs an offset binary type digital signal, thereby being inexpensive to produce, easy to be integrated having high function, and high in reliability.

13 Claims, 10 Drawing Sheets

36: CURRENT MIRROR

CURRENT MIRROR AMPLIFIER FOR USE IN AN OPTICAL DATA MEDIUM DRIVING APPARATUS AND SERVO-CIRCUIT

BACKGROUND OF THE INVENTION

1. Field of the Invention

This invention relates to an optical data medium driving apparatus, such as an optical disc or a photomagnetic disc, and more particularly to an optical data medium driving apparatus designed by paying attention to an amplifier for an output current of a detector detecting an error signal for driving a tracking servo mechanism and a focusing servo mechanism, and relates to a servo circuit for position controlling the light spot of, for example, an optical disc apparatus, espically a servo circuit inexpensive to be produced and of high reliability.

2. Description of the Prior Art

Recently, an information processing amount by a computer has increased steadily and an optical disc apparatus of larger recording amount has been noticed in order to record and reproduce the increased information, therefore the technology thereof is remarkably improving. In the optical disc apparatus, the information recorded on a data medium or to be recorded thereon is a micropit of 1 μm or less, whereby a focusing servo mechanism or a tracking servo mechanism is indispensable which restricts the laser beam to a micro spot light of diameter of about 1 μm to allow the laser light to impinge always on the medium surface regardless of surface deflection or track deflection of the data medium, whereby development of a servo mechanism of high accuracy has been desired.

In the conventional optical disc apparatus or a photomagnetic disc apparatus, when the information is recorded, there is a difference in the relative peripheral speed between an optical head and a disc at an inner periphery or an outer periphery. Hence, for obtaining the equivalent condition on the disc it is required to intensify the recording laser beam as it approaches the outer periphery. For this control, the information of track number prerecorded on the disc is demodulated and D/A converted, thereby controlling the laser power.

Meanwhile, since the servo system for driving the optical head, such as a tracking servo or a focusing servo, utilizes the reflected or transmitted light, a servo driving signal changes when the laser power changes or a reflection factor changes. Accordingly, in order to obtain a stable servo driving signal, the servo gain is required to be automatically changed so that the averaged servo driving signal may be obtained regardless of variation in the laser power and reflection factor of the disc.

Next, explanation will be given on a concrete example of an amplifier which automatically changes the servo gain, disclosed in the Japanese Patent Application Laid-Open Gazette No. 22746/1985.

FIG. 1 shows the conventional servo gain control circuit, in which reference numeral 117 designates a photosensor including four receiving surfaces known in the cylindrical lens method, which outputs from the upper side shown in the drawing three kinds of systems of a track error signal, a focus error signal and a total quantity of reflected light signa. Reference numeral 118 in the track error signal system designates a differential amplifier, and 119 and 121 designate amplifiers respectively. These amplifiers 118, 119 and 121 are connected in series and output a track servo driving signal to an output terminal 122. Reference numeral 123 in the focus error signal system designates a differential amplifier, and 124 and 126 designate amplifiers respectively, these amplifiers 123, 124 and 126 being connected in series and outputting the focus servo driving signal to an output terminal 127. The total quantity of reflected light system is so constituted that an inverting amplifier 128 and a filter 129 are connected in series, an output of the filter 129 is of negative polarity and connected in parallel to gate terminals G of field-effect transistors (to be hereinafter called FET) 120 and 125, the source terminals S of the FETs 120 and 125 are grounded, and the drain terminals D are connected to one input terminal of amplifiers 119 and 124 respectively.

FIG. 2 is a graph showing an example of a characteristic curve of gate voltage $V_{GS}$ to a resistance value $R_{DS}$ between the equivalent drain and the source of the FETs, which has a characteristic of a curve of secondary degree, wherein the center point of a linear region is represented by P.

Next, explanation will be given on operation of the servo gain control circuit shown in FIG. 1.

The output of the amplifier 128 is a total quantity of reflected light signal, which is removed by the filter 129 of noise component and then connected in parallel to gate terminals G at the FETs 120 and 125 respectively, so that the level variation in the total quantity of reflected light signal is applied as gate voltage $V_{GS}$ to the terminals G, and a resistance value $R_{DS}$ between the equivalent drain and source corresponding to the gate voltage $V_{GS}$ represented by the characteristic curve shown in FIG. 2 varies. When a resistance value of FET 120 is represented by $R_{DS4}$, that of FET 125 by $R_{DS9}$, resistance between one input terminal and the output terminal at the amplifier 119 by $R_3$, a resistance between the same at the amplifier 124 by $R_8$, and amplifier gains of the amplifiers 119 and 124 by $A_3$ and $A_8$, $A_3$ and $A_8$ are given in the following expressions:

$$A_3 = \frac{R_{DS4} + R_3}{R_{DS4}}, \quad A_8 = \frac{R_{DS9} + R_8}{R_{DS9}}, \quad (1)$$

whereby the amplifier gains are automatically controlled corresponding to variation in the resistance value $R_{DS}$ of each FET. In other words, as the total quantity of reflected light reduces, gate voltage $V_{GS}$ decreases in proportion thereto. Conversely, the servo driving signal output is designed to be averaged by utilizing an increase in the amplifier gain.

Since an intensity ratio of the laser light is large during the recording and the reproducing of the information, when the information is reproduced, the output of total quantity of reflected light, that is, the output of amplifier 128, is small, whereby a region of bad linearity at the FET characteristic shown in FIG. 2 is obliged to be used, thereby causing the defect that sufficient amplifier gain is not obtainable and a stable servo circuit is not realizable.

As the countermeasure for the above conventional defect, it is considered that during the reproduction the servo gain is made larger and during the recording the servo gain is changed corresponding to the output of total quantity of reflected light of an optical head, so that an automatic adjusting circuit for servo gain obtainable of a stable drive output for the optical head both when the information is reproduced and recorded regardless of variation in the total quantity of reflected light, is used.

In the disc apparatus provided with amplifiers for amplifying the track error signal and focus error signal from the optical head so as to adjust the servo gain for operating the tracking servo and focusing servo by the outputs of respective amplifiers, it is considered as the improvement for the above defect that a changeover switch for switching the gains of both the amplifiers by the switching signal for the recording and reproducing is provided and control means which stabilizes the outputs of both the amplifiers at about the equal level in spite of separation of the recording from the reproducing is provided.

FIG. 3 is a structural view of an example of the automatic adjusting circuit for the servo gain by applying the above improvement, in which only the components different from the conventional example shown in FIG. 1 are shown.

In FIG. 3, reference numerals 130 and 131 designate analog switches having contacts 136, 137 and 138, 139 respectively, which are driven by recording/reproducing gate signals inputted to the terminal 133, 132 designates an amplifier into which the total quantity of reflected light signal passing a filter 129 is inputted, and is output connects to the gate terminal G of a FET 120 through a contact 138 of the analog switch 131. The output of the filter 129 is branched to connect to the gate terminal G of the FET 120 through an contact 139. The source terminal S of the FET 120 is grounded, and the drain terminal D connects with one input terminal of an amplifier 119 and connects in common with the output terminal of the amplifier 119 through contacts 136 and 137 and resistances R134 and R135 at the analog switch 130 respectively.

Next, an explanation will be given on operation of the circuit shown in FIG. 3. The contacts 136 and 138 at the respective analog switches 130 and 131 are closed and those 137 and 136 are open when the input signal to the terminal 13 is reproduced, and they operate reversely when the input signal is recorded.

At first, the total quantity of reflected light signal obtained by all the composite outputs of the photosensor 117 shown in FIG. 1 is amplified so that the output is of negative polarity by the inverting amplifier 128. When the output is inputted as gate voltage to the FET 120 through the filter 129 at the next stage, the gain of amplifier 128 is so set that the mean value of inputted gate voltage, when the information is recorded, is positioned to get a proper linearity in FIG. 2 (namely the point P). When the information is reproduced, the laser power is lowered, and the amplifier (132) gain is so set that the inputted gate voltage at that time is about equal to the mean value during the recording. At this state, when the recording/reproducing gate signal is applied to the terminal 133, the input gate voltage of the FET 120 during the recording vertically varies in a range of nearly proper linearity around the point P on the characteristic curve in FIG. 2 and the gate voltage during the reproduction does not so fluctuate from the output (gate voltage access to the operating point P) decided by the function limit of amplifier 132.

Next, the servo gain is set. For example, when the track error signal of photosensor 117 is amplified by the differential amplifier 118, its output represents the direction and extent of track error, thereby being connected to a coil moving an objective lens to correct the track error through the amplifiers 119 and 121. Herein, the servo gain is set by the amplifiers 118 and 119, but the amplifier(119) gain is decided by the resistance value $R_{DS4}$ between the equivalent drain and source of FET 120 and the resistances R134 and R135. When the amplifier (119) gain is represented by $A_{3W}$ when recorded and by $A_{3R}$ when reproduced, the gain is given in the following expressions:

$$A_{3W} = \frac{R_{DS4} + R_{19}}{R_{DS4}}, \quad A_{3R} = \frac{R_{DS4} + R_{18}}{R_{DS4}} \qquad (2)$$

Here, when the gain of amplifier 128 is set on a basis of the mean value of the laser power during the recording, since the laser power during the reproducting is low, even when the gain of amplifier 132 is set, the servo gain tends to be short. Hence, the analog switch 130 is controlled by the recording/reproducing gate and values of resistance R134 and R135 are selected so as to obtain driving voltage to correct the track errors to about an equal extent during the recording and reproducing, thereby enabling the most suitable servo gain to be set.

Now, the circuit shown in FIG. 3 is described as to the track servo driving signal system, the focus error signal system is applicable in the same way as in FIG. 3. In the FIG. 3 circuit, the differential amplifier 118 is replaced by that 123 and the amplifiers 119 and 121 by those 124 and 126, thereby enabling a stable focus servo driving signal to be obtained.

As above-mentioned, the improved automatic gain control circuit for the servo gain is simple in construction, and, even when the output of the total quantity of reflected light fluctuates regardless division of the information for recording/reproducing, can always easily obtain the stable servo driving signal.

The conventional optical data medium driving apparatus and an improvement thereof are constructed as above-mentioned. In other words, the apparatus is provided with function (to be hereinafter called the auto gain control: AGC) such that the servo driving signal is divided by the total quantity of reflected light to average the servo driving signal to thereby maintain constant the servo loop gain regardless of variation in the laser power and reflection factor of the disc. Also, in order to compensate a narrow dynamic range of AGC, the gain switching stage for switching the gain at the step of reproducing/recording is provided at the preceding stage of the AGC.

In consideration of accuracy (about $\pm 1$ $\mu$m for focusing servo and about $\pm 1$ $\mu$m for tracking servo) and band (about 3 KHz for the gain crossover frequency) required to the optical disc servo, as the characteristic of AGC, the dynamic range is limited to five times through ten times the extent.

However, there are some data media for the optical disc having various characteristics. In consideration of the reflection factor after recording inclusive, variation in the reflection factor of the optical disc becomes about ten times larger.

The reproduction power is required to be changed to meet with the sensitivity of data medium and not to break the recording data. Also, the recording power is different depending on the kind of data medium. Furthermore, in consideration of an apparatus, such as the photomagnetic disc, which continuously lights the semiconductor laser by the power equivalent to or larger than the recording power to thereby erasing the recording data, even average variation in the laser power becomes about ten times larger.

Accordingly, for the optical disc or the photomagnetic disc, as a recording medium, having various characteristics mentioned above, the problem is created in that the conventional example only enlarging the AGC dynamic range by switching the preceding reproduction/recording is insufficient.

Meanwhile, there is another prior art relating to the AGC.

FIG. 4 is a block diagram of the servo circuit of the conventional optical data medium apparatus disclosed in the Japanese Patent Publication Gazette No. 28653/1983.

In FIG. 4, reference numeral 201 designates a photosensor for detecting a focus error of the light spot (not shown), which comprises two-divided light receiving surfaces 201a and 201b, reference numerals 202 and 203 designate current-voltage converters (to be hereinafter referred to as IV converter) which convert photocurrent signals inputted from the respective light receiving surfaces 201a and 201b into voltage. Reference numerals 204 and 205 designate operational amplifiers for obtaining a difference signal $V_X$ and a sum signal $V_Y$ of each output of the respective IV converters 202 and 203. Reference numeral 206 designates an analog divider which divides the difference signal $V_X$ by the sum signal $V_Y$ and constitutes normalization processing means for normalizing by the sum signal $V_Y$ the level variation of difference signal $V_X$ to be constant. Reference numeral 207 designates an actuator driving circuit for amplifying the output of analog divider 206. Reference numberal 208 designates a focus actuator for controlling the focal position of the light spot. The above components 201 through 208 comprise the auto focusing servo system.

Similarly, the auto tracking servo system comprises a photo sensor 209 comprising the two-divided light receiving surfaces 209a and 209b for detecting the track error of the light spot, IV converter 210 and 211, an operational amplifier for obtaining the difference signal $V_Z$ of the photosensor 209, analog divider 213, actuator driving circuit 214, and tracking actuator 215 for controlling tracking of the light spot. In addition, the sum signal $V_Y$ inputted to the analog divider 213 at the auto-tracking servo system uses the sum signal $V_Y$ of the division amplifier 205 at the auto focusing servo system.

Next, explanation will be given on operation of the conventional servo circuit shown in FIG. 4.

At first, the light receiving surfaces 201a and 201b at the focus error sensor 201 output a photocurrent corresponding to a received light quantity, the IV converters 202 and 203 converting current signals from the light receiving surfaces 201a and 201b into voltage.

The operational amplifiers 204 and 205 compute the difference signal $V_X$ and sum signal $V_Y$ of voltages from the respective IV converters 202 and 203, the analog divider 206 divides the difference signal $V_X$ by the sum signal $V_Y$. The actuator driving circuit 207 amplifiers the output of the analog divider 206 to drive the focus actuator 208 to position-control the light spot to be constant.

Similarly, the actuator driving circuit 214 drives the tracking actuator 215 corresponding to imbalance in quantity of received light on the light receiving surfaces 209a and 209b at the photosensor 209 so that the irradiation position of the light spot is position-controlled on a desired track.

Generally, when variation in the output from the light source for the light spot changes in phase the quantity of received light of the photosensors 201 and 209, the output level of difference signal $V_X$ with respect to the equal control error amount varies. The aforesaid analog divider 206 is used to normalize variation in output level corresponding to the quantity of received light, whereby the quantity of control error of the stable servo loop is obtained.

Such normalization processing means for dividing the difference signal $V_X$ by the sum signal $V_Y$ is well-known as disclosed in, for example, the Japanese Patent Publication Gazette No. 5293/1980.

The conventional servo circuit, as above-mentioned, uses the analog divider 206 in order to normalize the difference signal $V_X$. Since the analog divider 206 is required to have the frequency characteristic to the extent that a phase lag at the target servo region is not problematical and the dynamic range and accuracy in the range that an offset to cause a control error in the servo loop is not problematical, there is the problem that an expensive IC applied with laser trimming may inevitably be used.

Since the signal normalized by the analog divider 206 is an analog signal, the drift or aging cannot be neglected and the reliability is difficult to maintain thereby creating the problem in that all circuits must be analog processed and high analog technology are required to add function to have high performance.

SUMMARY OF THE INVENTION

The present invention has been designed in order to solve the above problem. A first object of the invention is to provide an optical data medium driving apparatus which uses a required number of current mirror circuits as an amplifier for amplifying an output current of a photosensor for obtaining a required servo driving signal, and is provided with gain switching means which computes a required current as to the amplified output current so as to compensate a dynamic range of AGC with respect to an optical disc or a photo magnetic disc as data medium having various characteristics, and is provided with an amplifier obtainable of a servo driving signal of high accuracy and a wide band.

A second object of the invention is to provide a servo circuit inexpensive to be produced, easy to integrate and have high function, and high in reliability, by providing an AD converter as normalization processing means outputting an offset binary type digital signal using the difference signal as the analog input and the sum signal as the reference input.

The above and further objects and features of the invention will more fully be apparent from the following detailed description with accompanying drawings.

DESCRIPTION OF THE PREFERRED EMBODIMENTS

Figure 5:
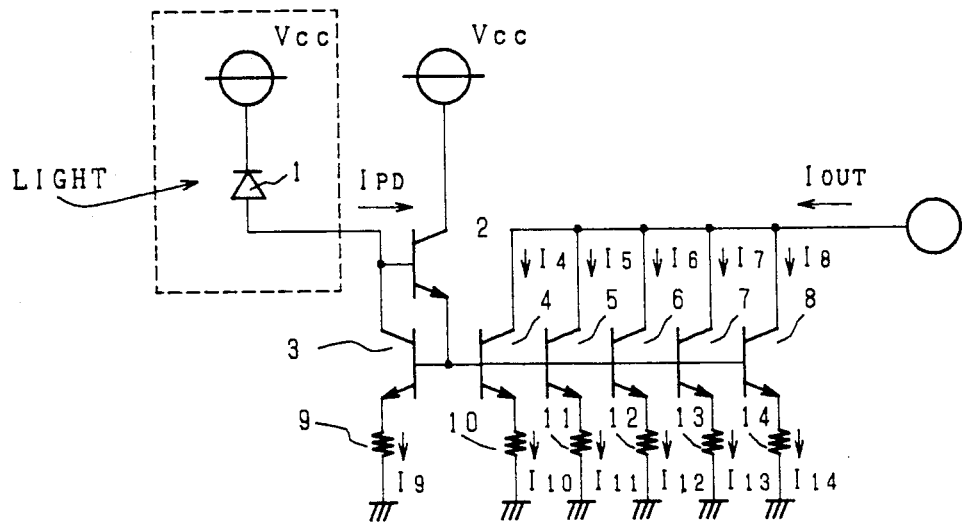
FIG. 5 is a circuit diagram of a photosensor and amplification means of a first embodiment of an optical data medium driving circuit of a first invention.

FIG. 5 is a circuit diagram of a photosensor and amplification means of a first embodiment of an optical data medium driving apparatus of the first invention.

In FIG. 5, an output current $I_{PD}$ of a photosensor 1 is amplified by a current mirror circuit 15 comprising transistors 2 through 8 of arranged characteristics, and resistances 9 through 14, thereby enabling the predetermined-fold (for example, 5-fold) output current $I_{out}$ to be obtained.

Next, explanation will be given on operation of the optical data medium apparatus shown in FIG. 5.

When the light impinges to the photosensor 1 comprising a PIN photodiode, the output current $I_{PD}$ in proportion to energy of the impinging light is obtained. Assuming that voltage between the emitter and the base of each transistor 2 or 3 is $V_{BE}$ and a resistance value of resistance 9 is $R_9$, the reversed bias voltage $E_{PD}$ needful to the PIN photodiode is given in the following equation:

$$E_{PD} \approx V_{CC} - 2V_{BE} - I_{PD} \cdot R_9 \quad (1)$$

It is recognized from the equation (1) that $R_9$ corresponding to the maximum value of $I_{PD}$ is selected to obtain a sufficiently larger $E_{PD}$ without sacrificing its frequency characteristic. In other words, for example, by selecting $I_{PD} \cdot R_9$ to be about equal to $V_{BE}$, $E_{PD} = V_{CC} - 3V_{BE} = V_{CC} - 2.1V$ and the reverse bias voltage near the supply voltage are applicable.

As seen from FIG. 5, since the base potential of the respective transistors 3 through 8 is always identical with each other, voltages $V_{BE}3$ through $V_{BE}8$ between the emitter and the base at the transistors 3 through 8 and resistance values $R_9$ through $R_{14}$ of resistances 9 through 14 corresponding to the above are adjusted corresponding to the required accuracy of the amplifier, whereby the relation between the emitter currents $I_9$ through $I_{14}$ flowing in resistances 9 through 14 is given in the following equation.

$$\begin{aligned} I_9 \cdot R_9 + V_{BE}3 &= I_{10} \cdot R_{10} + V_{BE}4 \\ &= \ldots = I_{14} \cdot R_{14} + V_{BE}8 \end{aligned} \quad (2)$$

The following relation should hold in a range of desired accuracy:

$$I_9 = I_{10} = \ldots I_{14} \quad (3)$$

Such operation is easily realizable by integrating close to each other on the same wafer the transistors 3 through 8 and resistances 9 through 14 corresponding thereto.

On the other hand, the collector current of transistor 3 is a difference obtained by subtracting the base current with respect to the transistor 2 from the output current $I_{PD}$ of the photosensor 1. The base current with respect to the transistor 2, when hfe of the respective transistors 2 through 8 is assumed to be equal to each other, is given in the following equation:

(Sum of base currents of transistors 3 through 8) ÷ hfe = (4)

(sum of collector currents of the same) ÷ $\frac{2}{hfe} \approx$ (collector current of transistor 3) × $\frac{6}{hfe^2}$ Assuming that hfe is enlarged to be, for example, 78 or more as to any transistor, it is recognized from the equation (4) that the collector current of transistor 3 coincides with the output current $I_{PD}$ of the photosensor 1 with accuracy of 0.1% or less.

Accordingly, the emitter current $I_9$ of transistor 3 is the sum of its base current and collector current, whereby $I_9$ in a range of accuracy decided by hfe of the transistor is given in the following expression:

$$\begin{aligned} I_9 &= \text{(Collector current of transistor 3)} + \\ &\quad \text{(base current of transistor 3)} \\ &= I_{PD} + \text{(base current of transistor 3)} \end{aligned} \quad (5)$$

Also, the relations among the emitter currents $I_{10}$ to $I_{14}$ and the collector currents $I_4$ to $I_8$ at the transistors 4 to 8 are given in the following expressions:

$$\begin{aligned} I_{10} &= I_4 + \text{(base current of transistor 4)} \\ I_{11} &= I_5 + \text{(base current of transistor 5)} \\ &\vdots \\ I_{14} &= I_8 + \text{(base current of transistor 8)} \end{aligned} \quad (6)$$

As seen from the expression (3), since the emitter currents $I_9$ of $I_{14}$ at the transistors 3 to 8 are equal to each other, when hfe of the respective transistors is in a predetermined range, the base currents with respect to the transistors 3 to 8 are included in a predetermined range, and the following expression is obtained from the expressions (3), (5) and (6):

$$I_{PD} = I_4 = I_5 = \ldots = I_8 \quad (7)$$

As seen from the expression (7), the output currents $I_4$ to $I_8$ equal to the input current $I_{PD}$ appear as it is reflected by the mirror, whereby the circuit 15 comprising transistors 2 to 8 and resistances 9 to 14 corresponding thereto is called the current mirror circuit.

The output current $I_{OUT}$ of the current mirror circuit 15 given as the sum of collector currents $I_4$ through $I_8$ of transistors 4 through 8 in the following expression:

$$I_{OUT}=I_4+I_5+\ldots+I_8=5\cdot I_{PD} \qquad (8)$$

Thus, it is recognized from the expression (8) that the current mirror circuit 15 operates as an amplifier having a 5-fold current amplification factor.

Such current mirror circuit, especially when integrated, can have high accuracy with ease.

Figure 6:
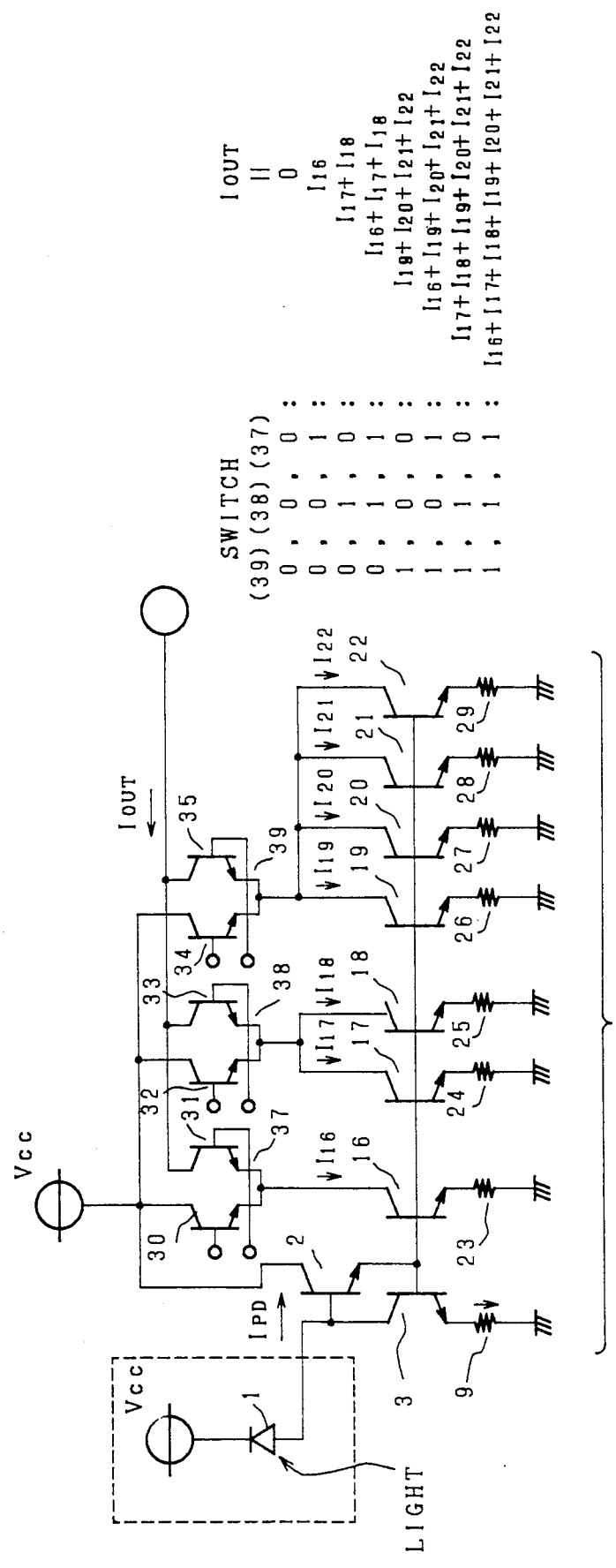
FIG. 6 is a circuit diagram of a photosensor and amplification means of a second embodiment of the first invention.

FIG. 6 is a circuit diagram of a photosensor and amplifiers of a second embodiment of an optical data medium drawing apparatus of the first invention.

In FIG. 6, the output current $I_{PD}$ of the photosensor 1 is amplified stepwise (for example, one-fold, two-fold or four-fold) by a current mirror circuit 36 comprising transistors 2, 3 and 16 to 22 arranging characteristics thereof and resistances 9 and 23 to 29. Such stepwise amplified current is switched by switches 37, 38 and 39 comprising transistors 30 through 35, thereby obtaining an output current $I_{OUT}$ of the properly amplified $I_{PD}$.

Next, explanation will be given on operation of the above.

The photosensor 1 and current mirror circuit 36 operate in the same way as those in FIG. 5, whereby the collector currents $I_{16}$ to $I_{22}$ of transistors 16 to 22 are equal to $I_{PD}$.

Meanwhile, the transistors 30 and 31, 32 and 33, and 34 and 35 constitute switches respectively, so that the current amplified by the current mirror circuit 36 is switched toward $V_{CC}$ side or the output terminal side. For example, at a switch 37 comprising the transistors 30 and 31, when the base potential of transistor 30 > base potential of
transistor 31+0.7V  (9), the transistor 30 is ON between the base and the emitter and transistor 31 is OFF between the base and the emitter, whereby the collector current $I_{16}$ of transistor 16 is coupled with $V_{CC}$ side through distance between the collector and the emitter. On the contrary, when the base potential of transistor 31 > the base potential
of transistor 30+0.7V  (9)', the collector current $I_{16}$ of transistor 16 is outputted through distance between the collector and the emitter of transistor 31.

Here, assuming that when the transistors 30, 32 and 34 at the $V_{CC}$ side of the switches 37, 38 and 39 are ON, these switches go to logical "0". On the contrary, when the transistors 31, 33 and 35 at the output side are ON, they go to logical "1", as shown in FIG. 6, $I_{OUT}$ is changed stepwise from 0 to $I_{16}+I_{17}+I_{18}+I_{19}+I_{20}+I_{21}+I_{22}$.

Since the following condition:

$$I_{PD}=I_{16}=I_{17}=I_{18}=\ldots=I_{22} \qquad (10)$$

should hold, $I_{OUT}$ varies from 0 to $1\cdot I_{PD}$, $2\cdot I_{PD}$, ..., $7\cdot I_{PD}$.

Thus, the current mirror circuit 36 and switches 37, 38 and 39 operate as an amplifier depending on conditions of the switches 37, 38 and 39 and having current amplification factors of eight stages from 0-fold to 7-fold stages.

In addition, although the accuracy is problematical, the current mirror circuit 36 may be constituted as discussed below with respect to FIGS. 7 and 8.

Figure 7:
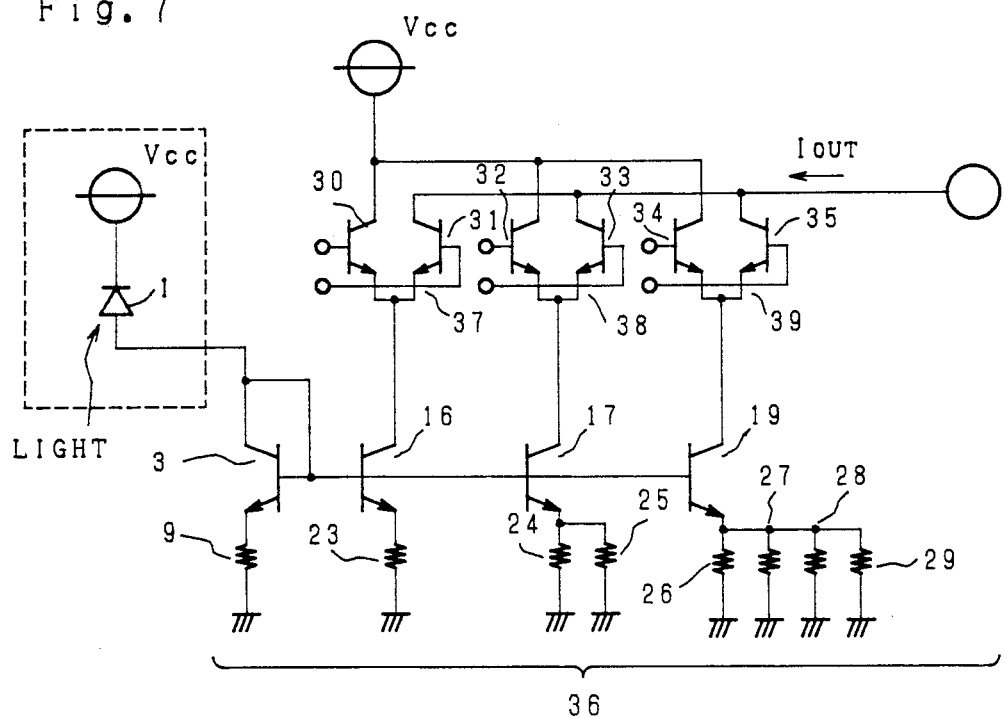
FIG. 7 is a circuit diagram of a photosensor and amplification means of a third embodiment of the first invention.

FIG. 7 is a circuit diagram of a third embodiment of the optical data medium driving apparatus of the first invention.

Referring to FIG. 7, two transistors 17 and 18 in FIG. 6 are replaced by one transistor 17, and similarly four transistors 19, 20, 21 and 22 by one transistor 19. In FIG. 7, the collector currents flowing in the transistors 16, 17 and 19 are different from each other, so that when the characteristics of transistors are uniform, voltage between the emitter and the base of each transistor is different from each other, thereby deteriorating accuracy of the current mirror circuit to that extent. Accordingly, when such a current mirror circuit as shown in FIG. 7 is adopted, the emitter areas of transistors 17 and 19 are made several times larger than that of transistor 16 and voltage between the emitter and the base of each transistor is arranged, thereby preventing the aforesaid accuracy from deteriorating to a certain extent.

Figure 8:
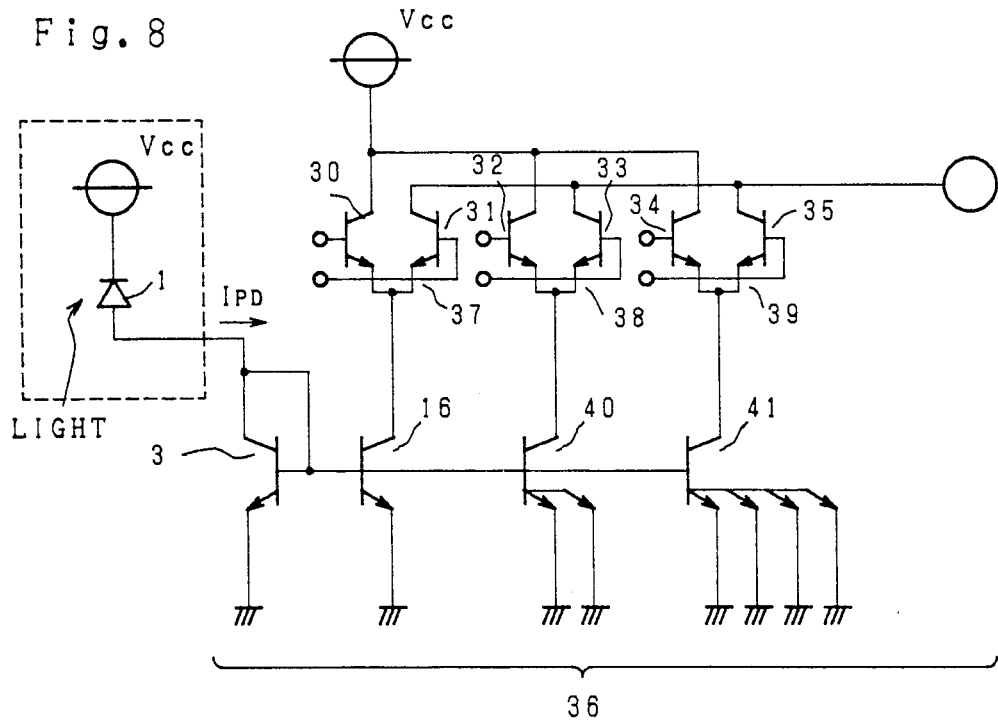
FIG. 8 is a circuit diagram of a photosensor and amplification means of a fourth embodiment of the first invention.

FIG. 8 is a circuit diagram of a fourth embodiment of the first invention, in which a current mirror circuit 36 has the emitter areas of transistors 40 and 41 two times and from times larger respectively than that of transistor 16, and various resistances are not shown in FIG. 8.

Assuming that hfe of the respective transistors 3, 16, 40 and 41 can be arranged with needed accuracy, since the base potential of transistors 3, 16, 40 and 41 is all equal to each other, the emitter currents of transistors 3 and 16 are equal to each other, the emitter current of transistor 40 is two times larger than that transistor 16, and the emitter current of transistor 41 is four times larger than that of transistor 16. The corresponding base currents similarly become two times and four times larger.

Hence, the collector current of transistor 16 is equal to an input current $I_{PD}$ to the current mirror circuit 36, that of transistor 40 is equal to $2\int I_{PD}$, and that of transistor 41 is equal to $4\cdot I_{PD}$.

In addition, referring to FIGS. 6, 7 and 8, the current amplification factors of the current mirror circuit at the plural stages are selected to be $2^R$ (R: integer, and the values for the above: 0, 1 and 2) and the values are switched by a proper current switch so that the entire gain is changed at $2^m$ stages (m: the number of stages in the current mirror circuit, m=3 for the above). Alternately, the gain may be nonlinearly changed by changing weight so as to widen the dynamic range by the current mirror circuit of the stages less in number.

Figure 9:
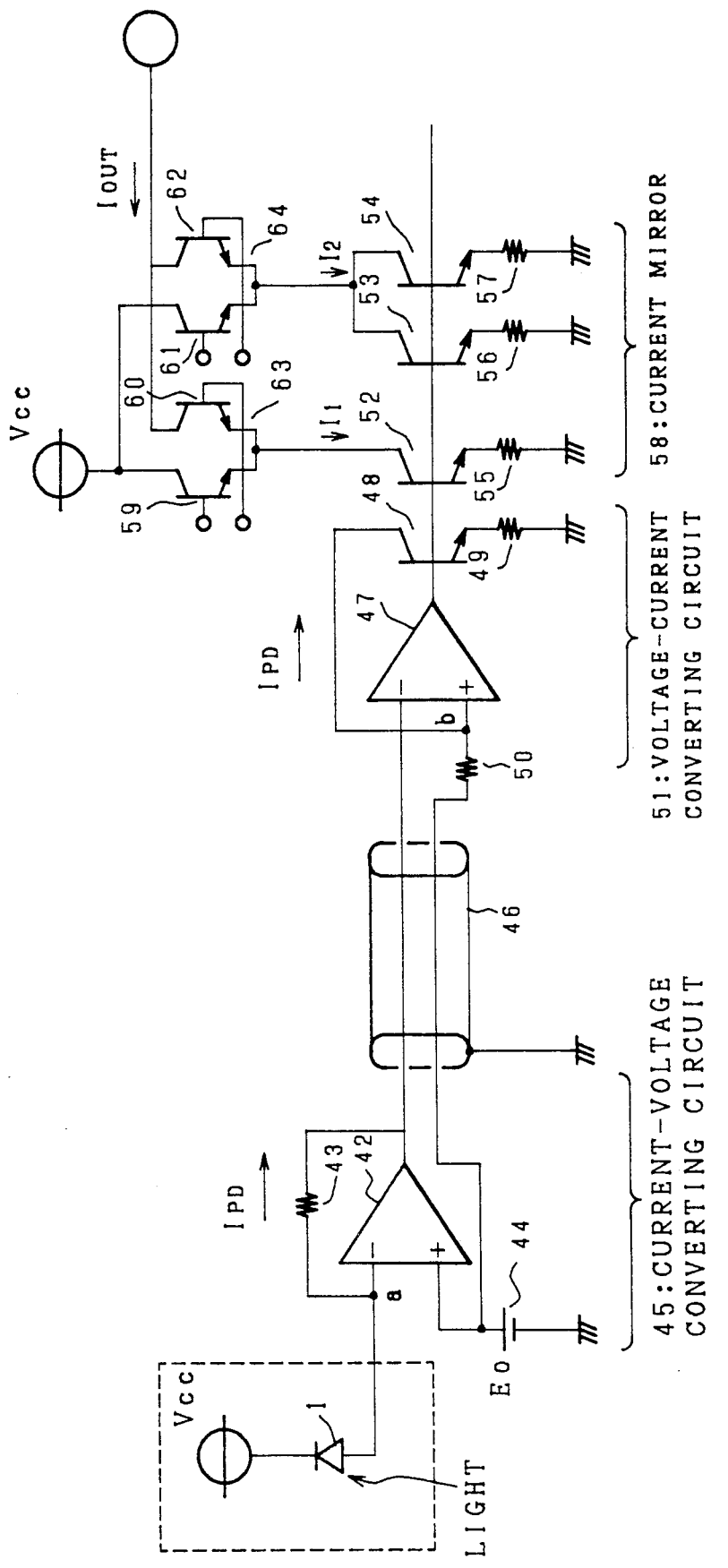
FIG. 9 is a circuit diagram of a photosensor, a current-voltage converter circuit, a voltage-current converter circuit, and amplification means, of a fifth embodiment of the first invention.

FIG. 9 is a circuit diagram of a fifth embodiment of the optical data medium driving apparatus of the first invention, mainly showing a photosensor, a current-voltage conversion circuit, a voltage-current conversion circuit and amplifiers.

In FIG. 9, an output current of a photosensor 1 is converted into the corresponding voltage signal by a current-voltage conversion circuit 45 comprising a resistance 43, an operational amplifier 42 and a power source 44. The voltage signal is transmitted to a transmission line 46 and then reconverted into the corresponding current signal by a voltage-current conversion circuit 51 comprising an operational amplifier 47, a transistor 48, and resistances 49 and 50. The current signal thus converted is applied to a constant current circuit 58 comprising the transistors 52 through 54 and the resistances 55 through 57. The collector currents outputted from the transistors 52 through 54 are equal in intensity to the reconverted current signal due to the property as the aforesaid current mirror circuit.

The collector current thus outputted is switched by switches 63 and 64 comprising transistors 59 through 62 respectively, so that the output current $I_{OUT}$ 0-fold, 1-fold, 2-fold or 3-fold as much as $I_{PD}$ (wherein resistance values of resistances 43 and 50 are made equal to each other) may be selectively obtained.

Next, explanation will be given on operation of the above.

The output current $I_{PD}$ of the photosensor 1 flows in the resistance 43 and potential at the point a is equalized to voltage $E_0$ of power source 44 due to operation of the operational amplifier 42. Now, assuming that a resistance value of resistance 43 is $R_{43}$, the output of operational amplifier 42 is a voltage signal of $E_0 - I_{PD} \cdot R_{43}$. The voltage signal and supply voltage $E_0$ are transmitted to the transmission line comprising, for example, a two-core shielded cable and then potential at the point b is made to be $E_0 - I_{PD} \cdot R_{43}$ by the operation of the optical amplifier 47. When the resistance value of resistance 50 is represented by $R_{50}$, the output is converted into a current signal as follows:

$$\frac{E_O - (E_{PD} - I_{PD} \cdot R_{43})}{R_{50}} = \frac{R_{43}}{R_{50}} \cdot I_{PD}$$

In addition, when $R_{43} = R_{50}$, the initial current $I_{PD}$ is restored.

The $I_{PD}$ becomes the collector current of transistor 48 and flows together with its base current in the resistance 49. As shown in FIG. 9, the base potential at the transistors 48 and 52 through 54 is always coincident, so that characteristics of the transistors and the resistances 49 and 55 through 57 are arranged to carry out the aforesaid function as the current mirror circuit. Therefore, the collector currents of transistors 52 through 54 coincide, with a predetermined accuracy, so that the constant current circuit 58 comprising the transistors 52 through 54 and resistances 55 through 57 operates in the same way as the current mirror circuit. Thus, the constant current circuit 58 outputs a current $I_1$, and a current $I_2$, 1-fold and 2-fold as much as $I_{PD}$ respectively. Hence, the gain can be changed across four stages from the 0-fold to 3-fold value depending upon the switching operation by the switches 63 and 64 comprising the transistors 59 through 62 and the input code with respect to said switches.

Figure 10:
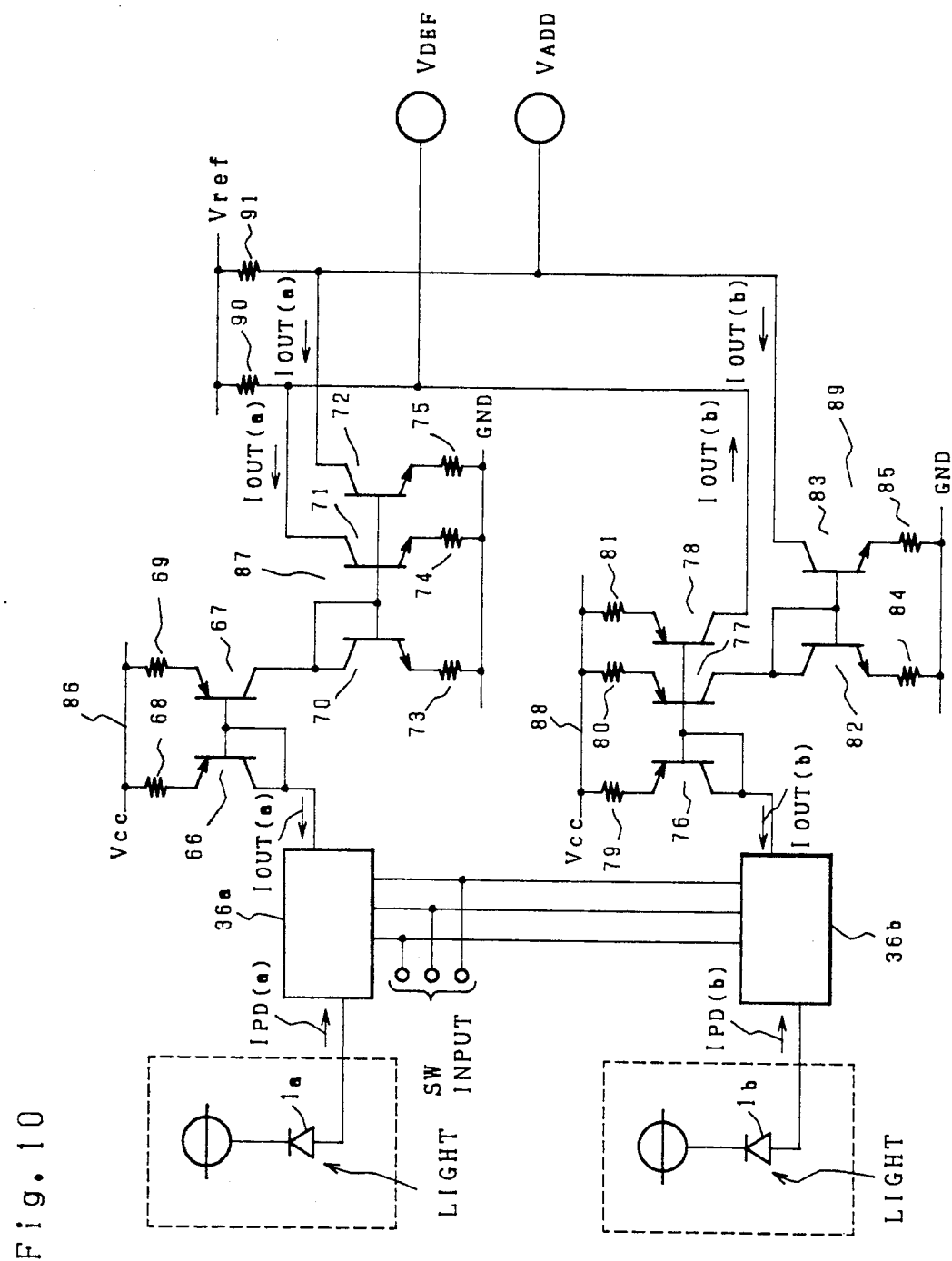
FIG. 10 is a circuit diagram of a photosensor, amplification means, and a post computer, of a sixth embodiment of the first invention.

FIG. 10 is a circuit diagram of a sixth embodiment of the optical data medium driving apparatus of the first invention, mainly showing photosensors, amplifiers and a post current computer.

FIG. 10 shows the case where output currents $I_{PD}(a)$ and $I_{PD}(b)$ of two photosensors 1a and 1b are amplified corresponding to a predetermined input code (SW input) by current amplifiers 36a and 36b.

From the amplified currents $I_{OUT}(a)$ and $I_{OUT}(b)$ are generated $+I_{OUT}(a)$, $+I_{OUT}(a)$, $-I_{OUT}(b)$ and $+I_{OUT}(b)$ by a current mirror circuit 86 comprising transistors 66 and 67 and resistances 68 and 69, a current mirror circuit 87 comprising transistors 70, 71 and 72 and resistances 73, 74 and 75, a current mirror 88 comprising transistors 76, 77 and 78 and resistances 79, 80 and 81, and a current mirror circuit 89 comprising transistors 82 and 83 and resistances 84 and 85, these currents flowing in resistances 90 and 91 leading to carry out a required current computation. As the result of the computation, $V_{DEF}$ and $V_{ADD}$ are given in the following equations:

$$V_{DEF} = V_{ref} - \{I_{OUT}(a) - I_{OUT}(b)\} \cdot R_{90}$$

$$V_{ADD} = V_{ref} - \{I_{OUT}(a) + I_{OUT}(b)\} \cdot R_{91}.$$

where resistance values of resistances 90 and 91 are $R_{90}$ and $R_{91}$.

Next, explanation will be given on operation of the above.

The internal operation of the respective current mirror circuits 86, 87, 88 and 89 are the same as the above-mentioned, description of which is omitted. An output current $I_{PD}(a)$ of the photosensor 1a is amplified by the current amplifier 36a to be $I_{OUT}(a)$. The amplified output current at last is equal to the collector currents of transistors 71 and 72 by operations of the current mirror circuits 86 and 87. On the other hand, an output current $I_{PD}(b)$ of the photosensor 1b is amplified by the current amplifier 36b to be $I_{out}(b)$. The amplified output current is operated by the current mirror circuits 88 and 89 to lastly be equal in the collector currents of transistors 78 and 83. The transistor 71 is of the NPN type and that 78 is of the PNP type, whereby the collector currents of both the transistors 71 and 78 are different in the direction from each other. Accordingly, when these collector currents are added so that the circuit is wired to flow the currents in the resistance 90, the added collector current is converted into a voltage signal as a voltage drop from the $V_{ref}$ potential. The converted output $V_{DEF}$ is given in the following equation:

$$V_{DEF} = V_{ref} - \{I_{out}(a) - I_{out}(b)\} \cdot R_{90}$$

thus obtaining a difference signal between $I_{out}(a)$ and $I_{out}(b)$. The transistors 72 and 83 are both of the NPN type and the collector currents of both the transistors are the same in the direction, so that when the collector currents are added so that the circuit is wired to flow the currents in the resistance 91, the added collector current is converted into the voltage signal as a voltage drop from the $V_{ref}$ potential. The converted output $V_{ADD}$ is given in the following equation:

$$V_{ADD} = V_{ref} - \{I_{OUT}(a) + I_{OUT}(b)\} \cdot R_{91}.$$

thus obtaining the sum signal of $I_{OUT}(a)$ and $I_{OUT}(b)$.

The difference signal thus obtained, when the photosensors 1a and 1b serve to detect the tracking error signal, is used as the tracking error signal for driving the tracking servo mechanism, and when the sensors 1a and 1b serve to detect the focusing error signal, is used as the focusing error signal for driving the focusing servo mechanism.

Meanwhile, the sum signal, when the photosensors 1a and 1b are for detecting the tracking error signal, similarly is used as the control signal for automatic gain control (AGC) of the tracking servo loop gain, and when for detecting the focusing error signal, is used as the control signal for automatic gain control (AGC) of the focusing servo loop gain.

Figure 11:
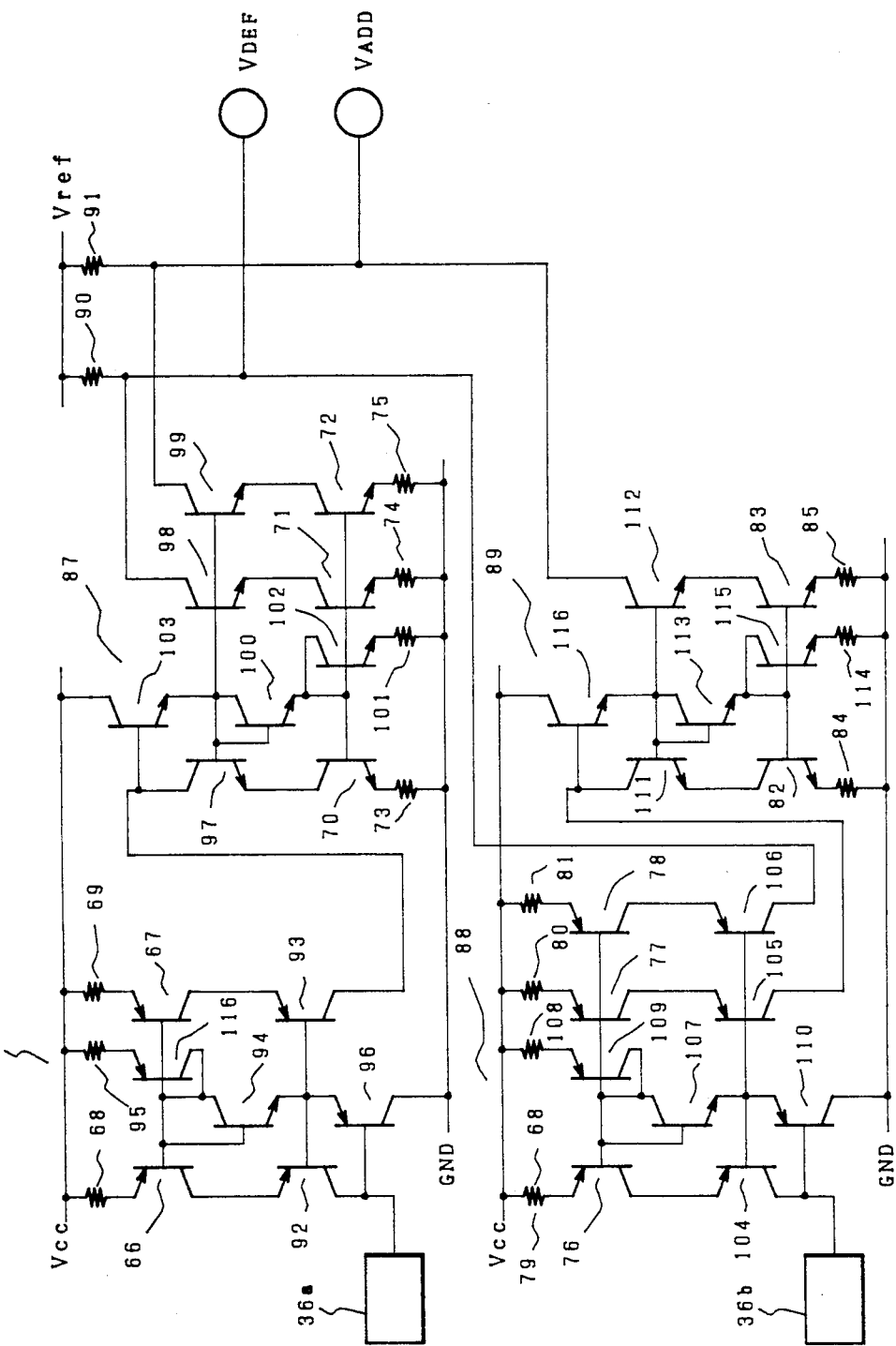
FIG. 11 is a circuit diagram of a current mirror circuit in detail of the sixth embodiment of the first invention.

In addition, in FIG. 10, the current mirror circuits 86, 87, 88 and 89 are shown of principal structure, but in consideration of the characteristic of transistor to be used and the required accuracy and response characteristic of the circuit itself, the circuit of structure as shown in FIG. 11 is actually used.

In FIG. 11, transistors 92, 93 and 94 included in a current mirror circuit 86 are used for operation as the current mirror circuit at high speed. Hence voltage between the collector and the emitter of each transistor 92 or 93 is used so that the collector potential of transistors 66 and 67 constituting the current mirror circuit is not changed by variation in output voltage of an amplifier 36a as the current source. In this case, the collector potential is about equal to the base potential. Thus, the transistor lower in withstanding voltage but at high speed is usable as a transistor constituting the current mirror circuit, and in the current mirror circuit, impedance of the collector at the current mirror transistor of the highest impedance can be lowered, thereby enabling the circuit to be operated at high speed. Similarly, transistors 97, 98, 99 and 100 included in a current mirror circuit 87 serve to operate at high speed as the current mirror circuit with respect to the transistors 70, 71 and 72 constituting the current mirror circuit, transistors 104, 105, 106 and 107 included in a current mirror circuit 88 serve similarly with respect to transistors 76, 77 and 78 constituting the current mirror circuit, and transistors 111, 112 and 113 included in a current mirror circuit 89 serve similarly with respect to transistors 82 and 83 constituting the current mirror circuit.

In the current mirror circuit 86, the transistor 116 and resistance 95 are for operation as the current mirror circuit at high speed and serve to lower impedance at the bases of transistors 66 and 67 constituting the current mirror circuit. Similarly, the transistors 102 and resistance 101 in the current mirror circuit 87 serve to operate the current mirror circuit at high speed with respect to the transistors 70, 71 and 72 constituting the current mirror circuit, the transistors 109 and resistance 108 in the current mirror circuit 88 serve similarly with respect to the transistors 79, 80 and 81 constituting the current mirror circuit, and the transistor 115 and resistance 114 in the current mirror circuit 89 serve similarly with respect to the transistors 82 and 83 constituting the current mirror circuit.

Also, a transistor 96 included in the current mirror circuit 86 serves to raise the accuracy as the current mirror circuit. An input current to the current mirror circuit 86 is divided into the collector current of transistor 66 and the base current of the respective transistors 66, 67, 92 and 96. When hfe of these transistors is small and intensity of the base current with respect to the collector current cannot be neglected, the current mirror circuit deteriorate in accuracy. Hence, the transistor 96 is interposed between the base of each transistor 66, 67, 92 and 93 and the input current terminal and further a ratio of the base current to the collector current is made $hfe^2$, thereby improving the accuracy as the current mirror circuit. Similarly, a transistor 103 is provided to improve the accuracy with respect to the current mirror circuit 87, a transistor 110 similarly with respect to the current mirror circuit 88, and a transistor 116 similarly with respect to the current mirror circuit 89.

In addition, although explanation was not made in the first through sixth embodiments, the data medium requiring the tracking servo and focusing servo is not limited to the optical disc or a photo-magnetic disc, but includes an optical card, a photo sheet or an optical drum.

The data medium itself for use may be of various structures, such as metal, oxide, various inorganic compounds, or organic compounds.

Also, the converging lens included in the apparatus may optionally use a desired lens, such as an aspherical lens, a hologram lens, an diffraction grating, or a Fresnel lens as well as the spherical lens, when having the converging lens function.

Furthermore, the photosensor used may not be limited to the PIN photodiode, but may be of any type, such as a PN photodiode, an avalanche photodiode, PSD or a solar cell, when a signal is obtained as the current information.

As above-mentioned, the optical data medium driving apparatus of the first invention, which is adapted to amplify by the required current mirror the output current of the photosensor for detecting an error signal required to drive the tracking servo mechanism or the focusing servo mechanism, and can devise a wide band, low offset and low noise of the signal processing system, thereby having the effect that reliability of the entire optical data medium driving apparatus can be improved by a small number of parts and the apparatus is small-sized and integrated.

Figure 14:
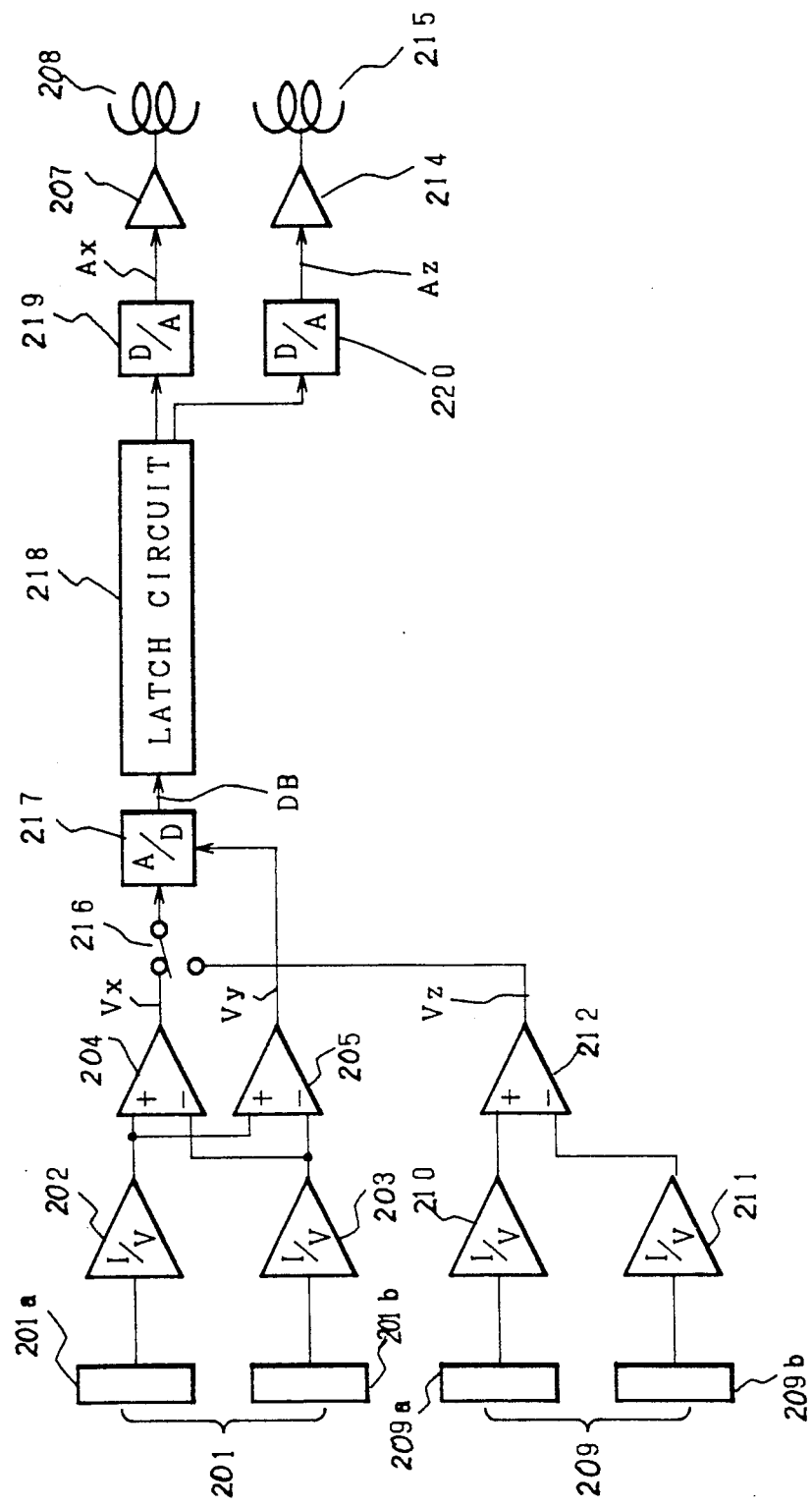
FIG. 14 is a block diagram of a servo circuit of the second invention.

Next, explanation will be given on a first embodiment of a second invention. FIG. 14 is a block diagram thereof, in which the components designated by reference numerals 201 through 205, 207 through 212, 214, and 215 are the same as those in the second conventional example.

Reference numeral 216 designates a switch for switching the respective difference signals $V_X$ and $V_Z$ from the operational amplifiers 204 and 212 by time sharing.

Reference numeral 217 designates an AD converter given a difference signal $V_X$ (or $V_Z$) as an analog input and a signal $V_Y$ as the reference input and outputting an offset binary type digital signal DB, which is adapted to normalize the analog difference signal $V_X$ (or $V_Z$) by the sum signal $V_Y$.

Reference numeral 218 designates a latch circuit comprising a flip-flop for latching the digital signal DB, and 219 and 220 designate DA converters which convert the digital signal DB passing through the latch circuit 218 into analog signals $A_x$ and $A_z$ corresponding to the difference signals $V_X$ and $V_Z$ respectively, the analog signals $A_x$ and $A_z$ from the respective converters 219 and 220 being inputted into the actuator driving circuits 207 and 214 respectively.

In addition, in this embodiment, the switch 216 switches the difference signals $V_X$ and $V_Z$ so as to be an analog input to AD converter 217 and the latch circuit 218 continuously inputs the digital signal DB to the DA converters 219 and 220, but when structure of the same as the AD converter is connected to the operational amplifier of tracking servo system, the switch 216 and latch circuit 218 are needless.

Next, explanation will be given on operation of the FIG. 14 embodiment of the second invention.

At first, as is illustrated the case where the switch 216 selects the difference signal $V_x$ representing the focus error signal as shown, will be described. The AD converter 217 divides the difference signal $V_x$ by the sum signal $V_y$ to execute normalization of difference signal $V_x$ so as to output the offset binary type digital signal DB. For example, when the AD converter 217 is of 8-bits, the digital signal DB obtains values of 0 to 255 dispersed corresponding to the difference signal $V_x$, but the center of the operating point is of a value in the vicinity of the code data 127. In addition, the AD converter 217 used for this kind of servo circuit is sufficient accurate with an IC of 8-bit class.

The digital signal DB normalized by the AD converter 217 is latched by the latch circuit 218 and then converted into the analog signal by the DA converter 219, thereby driving a focus actuator 208 through the actuator driving circuit 207.

On the other hand, when the switch 216 is turned to input the difference signal $V_z$ into the AD converter 217, the tracking actuator 214 is driven on the basis of the standardized digital signal DB similarly to the above.

Figure 12:
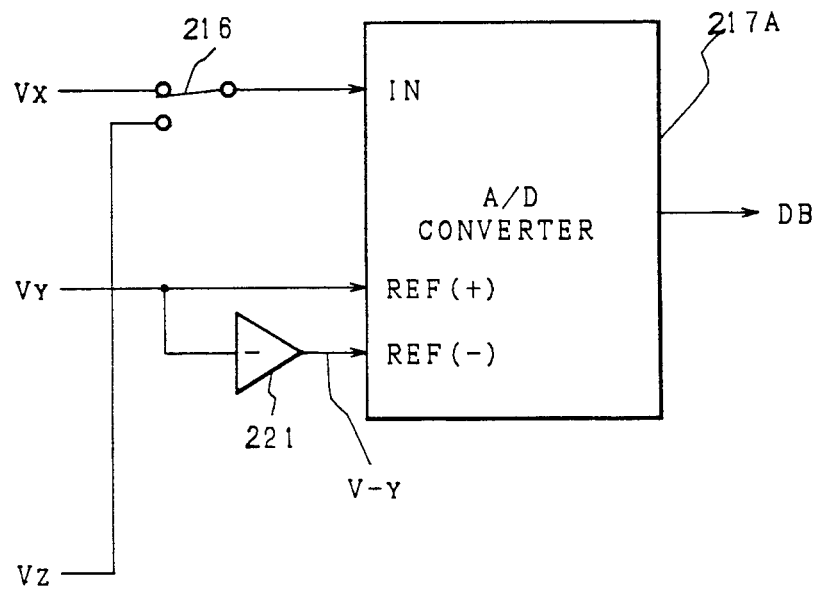
FIG. 12 is a block diagram of a first embodiment of normalization processing means of a second invention.

FIG. 12 is a block diagram of concrete structure of an embodiment of normalization processing means shown in FIG. 14, in which reference numeral 217A designates and AD converter corresponding to the AD converter 217, and 221 designates an inverting amplifier to invert the polarity of the sum signal V.

The AD converter 217A has to reference input terminals REF(+) and REF(−) other than an analog input terminal IN, the difference signal V (or V) is applied as the analog input to the analog input terminal IN, the sum signal V is applied as the positive reference input to the reference input terminal REF(+), and a signal $V-_y$ inverted of the polarity of the sum signal V, is applied as the negative reference input to the reference input terminal REF(−).

Next, the operation of one embodiment of normalization processing means shown in FIG. 12 will be described with reference to FIG. 14, wherein in the same way as the above the switch 216 is assumed to select the difference signal V and explanation will be given paying attention to the focus servo system.

At first, assuming that the outputs of IV converters 202 and 203 are positive, the output offset reference values of IV converters 202 and 203 are preset at $V_0$ (>0). However, when an electric circuit system operates by two positive and negative power sources, the output offset reference value is usually set to the ground.

Since the difference signals $V_x$ and $V_z$ outputted from the respective operational amplifiers 204 and 205 is superposed thereon with offset voltage $V_0$ equal to the output offset reference value $V_0$, a voltage value of difference signal $V_x$ is represented by $(x+V_0)$, a voltage value of sum signal $V_y$ by $(y+V_0)$, and a voltage value of a signal $V-_y$ inverted of the polarity of the sum signal $V_y$ by $(-y+V_0)$.

The AD converter 217A compares the difference signal V and reference voltage value from $(y+V_0)$ to $(-y+V_0)$ with an indented width corresponding to the resolution (bit number) of AD converter 217A itself and encodes the difference signal $V_x$. Accordingly, the digital signal DB, when x=y, includes the full code; when x=−y, the zero code; and, when x=0, the ½ full code. In detail, the digital signal DB, when the entire light spots are irradiated onto one photosensor 201a and the quantity of light received by the photosensor 201b is zero (x=y), becomes full codes. Conversely, when the quantity of received light by photosensor 201a is zero (x=−y), the signal DB becomes zero code, thereby obtaining coded data normalized of voltage value x in the difference signal $V_x$ by the voltage value y in the sum signal $V_y$.

At this time, when the difference signal V is $V_0$, that is, x=0, since the coded data in the digital signal DB has an offset of ½ full code, the digital signal DB becomes the offset binary type signal.

For example, when the AD converter 217A is of 8-bits, the center of operating point by the ½ offset is a coded data value about 127 with respect to full code 255. In other words, the point where the light spot is uniformly irradiated on each photosensor 201a or 201b, becomes the center of operating point and coincides with the control center of the focus servo.

The DA converter 219 allows the zero data "0" of digital signal DB to correspond to −128 and full data "255" to 127 on the basis of the offset binary type digital signal DB thus obtained, so that an analog signal $A_x$ is outputted to put the control (operating point) center to zero, thereby driving-controlling the focus actuator 208.

For tracking position control, an analog signal $A_z$ similarly driving-controls a tracking actuator 215.

Figure 1:
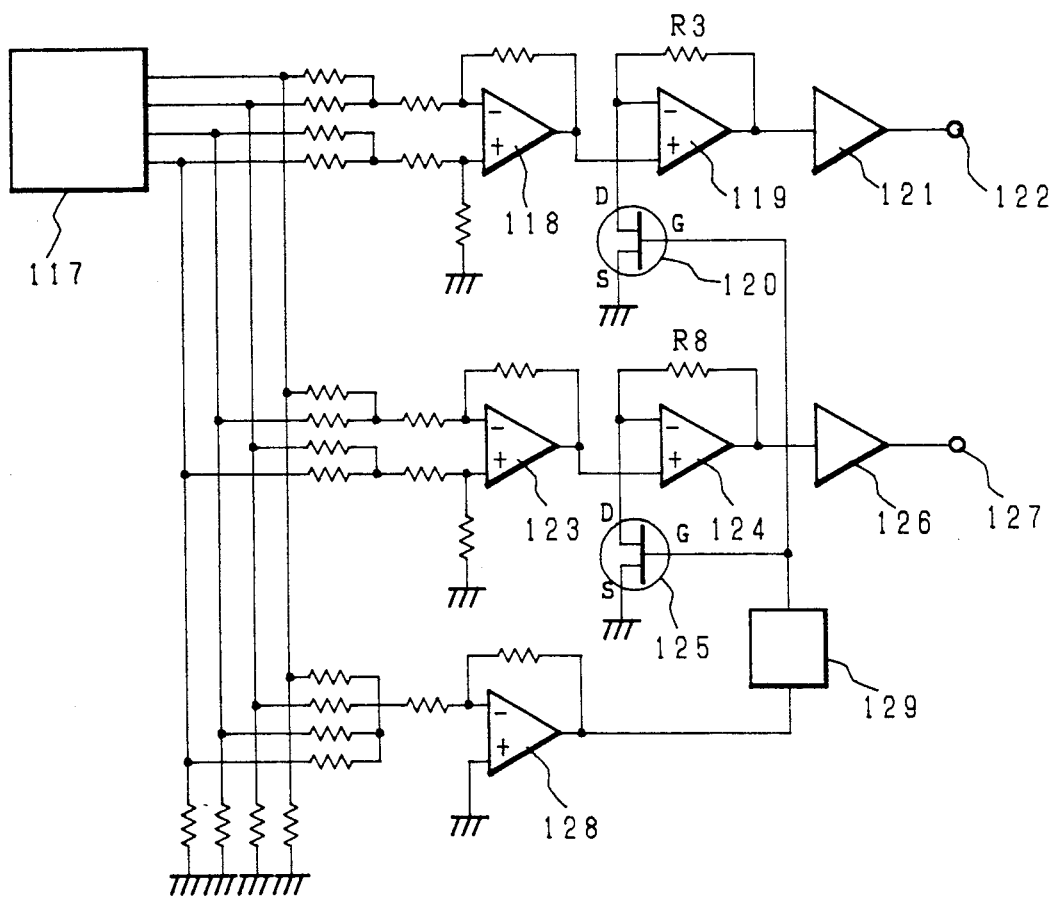
FIG. 1 is a circuit diagram of the conventional servo gain control circuit.
Figure 2:
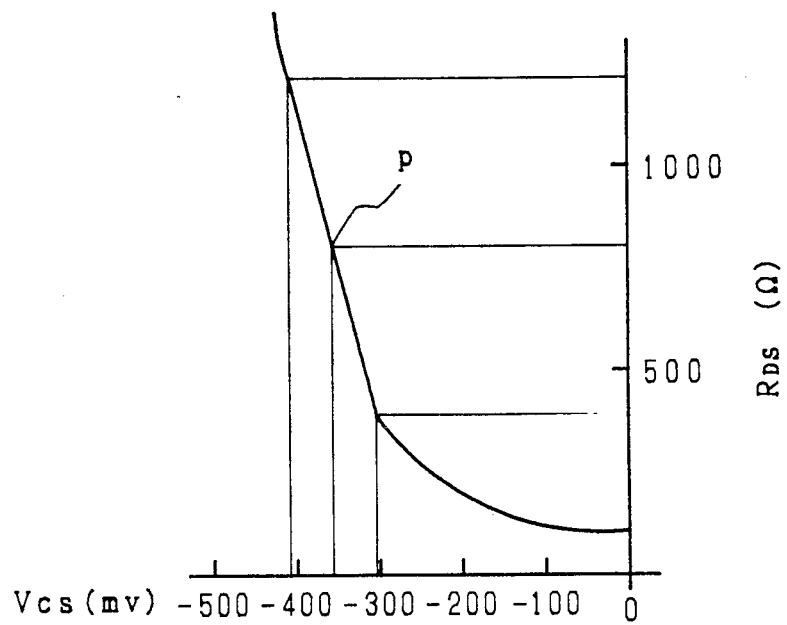
FIG. 2 is an illustration of operation thereof.
Figure 3:
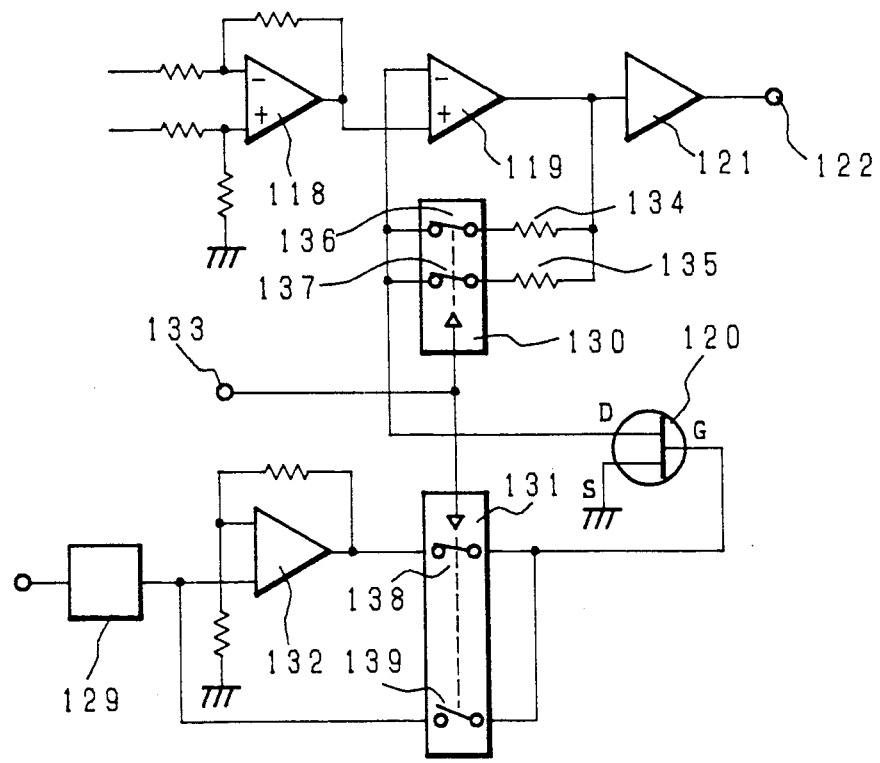
FIG. 3 is a circuit diagram of an improved conventional example of the servo gain control circuit.
Figure 4:
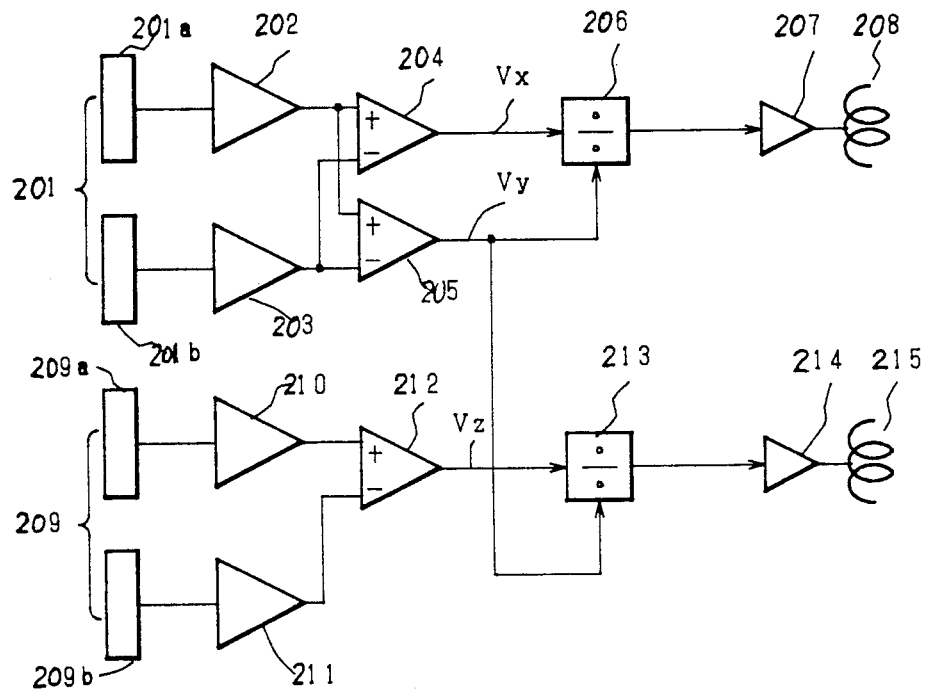
FIG. 4 is a block diagram of another conventional example of the servo circuit.

FIG. 3 is a block diagram another embodiment of the normalization processing means of the second invention, in which reference numeral 217B designates an AD converter corresponding to the AD converter 217, 231 designates an operational amplifier to obtain a half of sum signal $V_y$, and 232 designates an operational amplifier for adding a signal $V_{y/2}$ from the operational amplifier 231 with the difference signal $V_x$.

The AD converter 217B has another reference input terminal REF other than the analog input terminal IN, a signal $V_x'$, (or $V_z'$) from the operational amplifier 232 is inputted to the analog input terminal IN, and the sum signal $V_y$ is inputted to the reference input terminal REF.

Figure 13:
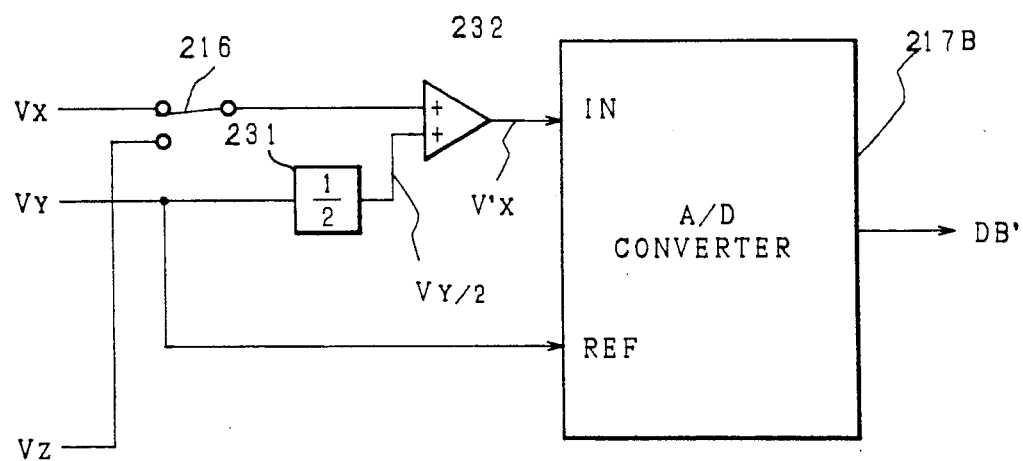
FIG. 13 is a block diagram of a second embodiment of normalization processing means of the second invention.

Next, explanation will be given on operation of the normalization processing means shown in FIG. 13.

The sum signal $V_y$ is a half signal $V_{y/2}$ by the operational amplifier 231 and then added with the difference signal $V_x$ by the operational amplifier 232 to be the analog input signal $V_x'$, thereby being input to the analog input terminal IN of AD converter 217B, a voltage value of the analog input signal $V_x'$ being represented by $[x+(y/2)+V_0]$ because the offset voltage $V_0$ is superposed.

On the other hand, the sum signal $V_y$ of voltage value $(y+V_0)$ is input directly to the reference input terminal REF of AD converter 27B as the reference voltage.

The AD converter 217B compares at indented widths corresponding to the resolution of AD converter itself the voltage value $[x+(y/2)+V_o]$ of the analog input signal $V_x'$ with the voltage from offset voltage $V_0$ to reference voltage $(y+V_0)$, thereby encoding the analog input signal $V_x'$.

Accordingly, a digital signal DB' outputted from the AD converter 217B includes coded data which is full code when x=y/2, zero code when x=−y/2, and ½ full code when x=0, resulting in that the coded data (error signal) normalizing the voltage value x by that y is included in the same way as above-mentioned. Also, the digital signal DB' is superposed with offset which is ½ full code when x=0, thereby being of the offset binary type signal.

Next, the actuators 208 and 215, in the same way as above-mentioned, is positioned and driven so that the focal point of the light spot is at the center of the servo (the operating point).

As seen from the above, when the AD converter 217 normalizing and digitizing the error signal and outputting the offset binary type digital signal DB is used as the normalization processing means, the IC of 8-bit class inexpensive to be produced and easy to be integrated can be used, thereby obtaining the servo circuit easy to add function and less affected by drift and aging.

In addition, the two embodiments of the normalization means are described of the optical disc apparatus as the target, but they may of course be applicable to normalization of error signals at the servo circuit at the photo magnetic disc or other apparatus.

As seen from the above, the second invention uses as the normalization processing means the AD converter which is given the difference signal of the error sensor as the analog input and the sum signal as the reference input so as to output the offset binary type digital signal, thereby having the effect that the servo circuit inexpensive to produce, easy to integrate and have high function, and higher in reliability.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. An optical data medium driving apparatus and a servo circuit, comprising:
    a photosensor which outputs a current signal corresponding to a quantity of transmitted light or reflected light from an optical data medium;
    an amplification means intercoupled to and receiving said photosensor output current signal including a current mirror circuit having a plurality of switching elements, each switching element providing a current signal equal to said photosensor output current signal; and
    means for combining selected ones of said current signals thereby amplifying said output current signal from said photosensor by said current mirror circuit.

2. An optical data medium driving apparatus and a servo circuit as set forth in claim 1, wherein said amplification means includes a plurality of current mirror circuits each current mirror circuit having a different amplification factor, and wherein the combining means includes switching means for selecting an output of at least one of said current mirror circuits, so that the photosensor output current signal is amplified by the plurality of said current mirror circuits, the output signal of at least one of said current mirror circuits is selected by said switching means, thereby providing variable amplification of the photosensor output current signal.

3. An optical data medium driving apparatus and a servo circuit as set forth in claim 2, wherein the amplification factor of each of said current mirror circuit in the plurality of current mirror circuits is described by $2^{n+1}$, $2^{n+2}$, ... $2^{n+m}$ (n: integer, m: number of current mirror circuits) and the respective amplification factors of each of said current mirror circuits are stepwise variable from $$2^{n+1} \text{ to } \sum_{k=1}^{m} 2^{n+k}.$$

4. An optical data medium driving apparatus and a servo circuit as set forth in claim 1, wherein said amplification means includes a preconverter having an input and an output and means coupling the photosensor output current signal to the input of the preconverter and means coupling the output of the preconverter to the current mirror circuit, said preconverter comprising a first means for converting the photosensor output current signal to a voltage signal and a second means for converting the voltage to a current signal to be input to the current mirror circuit, and thereafter said current mirror circuits amplify said current signal.

5. An optical data medium driving apparatus and a servo circuit as set forth in claim 1, further comprising:
    at least one additional photosensor which outputs a current signal corresponding to a quantity of transmitted light or reflected light from an optical data medium;
    at least one additional amplification means intercoupled to and receiving said additional photosensor output current signal including a current mirror circuit having a plurality of switching elements, each switching element producing a current signal equal to said at least one additional photosensor output current signal;
    at least one additional means for combining selected ones of said additional current signals, thereby amplifying said additional output of current signal from said additional photosensor by said additional current mirror circuit; and
    means, intercoupled to the combining means and the at least one additional combining means, for adding and subtracting said amplified current signals.

6. An optical data medium driving apparatus and a servo circuit as set forth in claim 2, wherein the current mirror circuits include switching elements comprising transistors having different resistances connected to respective emitters of the transistor.

7. An optical data medium driving apparatus and a servo circuit according to claim 2, wherein the current mirror circuits include switching elements comprising transistors having multiple emitters.

8. An optical data medium driving apparatus and a servo circuit, comprising a photosensor which outputs a current signal corresponding to a quantity of transmitted light or reflected light from an optical data medium, an amplification means, means coupling the output current signal from said photosensor to said amplification means, said amplification means comprising a current mirror circuit including a plurality of switching elements, and means for intercoupling the switching elements so as to provide respective element current signals that are equal to the photosensor output current signal while combining selected ones of said element current signals to thereby provide amplification of said photosensor output current signal.

9. An optical data medium driving apparatus as set forth in claim 8 wherein said means for intercoupling includes means for intercoupling the switching elements directly in a parallel array.

10. An optical data medium driving apparatus and a servo circuit, comprising:
    a photosensor which outputs a current signal corresponding to a quantity of transmitted light or reflected light from an optical data medium;
    an amplification means for amplifying the photosensor output current signal, the amplification means including a current mirror circuit having a plurality of switching elements, each switching element providing a current signal being one of a current signal equal to the photosensor output current signal and a current signal equal to a multiple of the photosensor output current signal;

means for connecting the photosensor output current signal to each switching element in the plurality of switching elements in the amplification means; and means for combining selected ones of the current signals thereby amplifying the photosensor output current signals thereby amplifying the photosensor output current signal from the photosensor by the current mirror circuit.

11. An optical data medium driving apparatus and a servo circuit as set forth in claim 10, wherein each switching element includes a control electrode and the coupling means couples the photosensor output current signal to the control electrode of each switching element.

12. An optical data medium driving apparatus and a servo circuit as set forth in claim 11, wherein each switching element includes a transistor having a base and wherein the control electrode is coupled to the base.

13. An optical data medium driving apparatus and a servo circuit, comprising:

a photosensor which outputs a current signal corresponding to a quantity of transmitted light or reflected light from an optical data medium;

an amplification means for amplifying the photosensor output current signal, the amplification means including a current mirror circuit having a plurality of switching elements and at least one current determining means associated with each switching element and each providing a current signal substantially equal to the photosensor output current signal;

means for connecting the photosensor output current signal to each switching element in the plurality of switching elements; and means for combining selected ones of the current signals thereby amplifying the photosensor output current signal from the photosensor by the current mirror circuit.

* * * * *